United States Patent
Borsi et al.

(10) Patent No.: US 6,469,515 B2
(45) Date of Patent: Oct. 22, 2002

(54) METHOD FOR DETERMINING SOURCES OF INTERFERENCE

(75) Inventors: Hossein Borsi, Hannover (DE); Arthur Kaindl, Erlangen (DE); Stefan Nowak, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 1 day.

(21) Appl. No.: 09/813,435

(22) Filed: Mar. 20, 2001

(65) Prior Publication Data

US 2001/0048305 A1 Dec. 6, 2001

(30) Foreign Application Priority Data

Mar. 20, 2000 (DE) .......................... 100 13 671

(51) Int. Cl.⁷ .......................... G01R 31/00; G01R 31/08
(52) U.S. Cl. ........................ 324/536; 324/539
(58) Field of Search .................. 324/539, 127, 324/523, 528, 543, 532–536, 634, 654, 655

(56) References Cited

U.S. PATENT DOCUMENTS 4,887,041 A * 12/1989 Mashikian et al. ......... 324/533
6,161,077 A * 12/2000 Fawcett ..................... 324/523

FOREIGN PATENT DOCUMENTS

| DE | 197 08 585 A1 | 5/1998 |
| DE | 197 34 552 | 2/1999 |
| DE | 198 02 551 | 8/1999 |

* cited by examiner

*Primary Examiner*—N. Le
*Assistant Examiner*—Amy He
(74) *Attorney, Agent, or Firm*—Schiff Hardin & Waite

(57) ABSTRACT

A method for determining sources of interference that cause partial discharges in an encapsulated conductor structure of a magnetic resonance apparatus, particularly in a gradient coil. Under the method, a low-frequency high voltage is applied to a conductor, and signals resulting from an adjacent high voltage are measured within a frequency range located in the kHz range, particularly from 40 to 400 kHz. The signals are analyzed in order to determine partial discharges. The conductor is again charged with a low-frequency high voltage and additional signals are measured within a frequency range located in the MHz range, particularly from 10 to 300 MHz. The additional signals are analyzed in order to determine partial discharges.

10 Claims, 3 Drawing Sheets

METHOD FOR DETERMINING SOURCES OF INTERFERENCE

BACKGROUND OF THE INVENTION

1. Field of the Invention

The present invention pertains to methods for determining sources of interference, particularly sources of interference in a magnetic resonance apparatus that cause partial discharges in an encapsulated conductor structure.

2. Discussion of the Related Art

In magnetic resonance equipment generally, dynamic magnetic fields having linear gradients are superimposed on the static magnetic field in all three spatial directions. A gradient coil provided with at least three separate conductors, i.e., coils, is used. In order to achieve a desired compact construction, a high degree of mechanical strength and a high voltage strength, the intermediate spaces of the gradient coil are encapsulated with an insulating material, such as a flexible bisphenol-A system having anhydride hardeners.

A gradient coil typically has a diameter of approximately 100 cm, while the length dimensions can fluctuate between 120 and 200 cm. Based upon the encapsulation volumes resulting therefrom, with a typical reaction resin compound requirement of between 300 and 600 kg, it is obvious that during casting flaws, such as bubbles, shrink between 300 and 600 kg, it is obvious that during casting flaws, such as bubbles, shrink holes and cracks, will often arise that significantly decrease the voltage strength. These flaws form locations for the occurrence of partial discharges, whose probability increases as the voltage increases.

A basic method and apparatus for partial discharge measurement is described in DE 198 02 551, which shows that the apparatus is arranged on the lower coil, from which the partial discharge can be measured.

Partial discharges are partial breakdowns in a dielectric, triggered by a local field strength peak, which can for example be caused at the cited flaws in the insulating material. Since during operation, the gradient coils are charged with a high voltage in the range of several kV, a gradient coil having flaws is expected to have such partial discharges. In general, the threshold voltage of this partial discharge is thereby lower than the breakdown or dielectric strength of the dielectric material.

The actual risk to a component presented by partial discharges lies in the occurrence of irreversible destruction in sub-regions of the dielectric, and in the increased probability of a complete breakdown. However, such partial discharges also have a disadvantageous effect on the image exposure process, because image disturbances can for example be caused in the receive system of a magnetic resonance apparatus. In the recorded resonance image, these image disturbances are expressed in the form of what are known as spikes.

Conductor structures of this sort, in which it is highly probable that sources of interference will arise during manufacture, are first subjected to a quality and function test before their final installation in an apparatus, for example a magnetic resonance apparatus. The purpose of the test is to discover whether the conductor structures will operate in problem-free fashion or whether the conductor structures will tend to generate image disturbances. During the test, a high voltage is hereby applied to a conductor of the conductor structure, while a second, adjacent conductor, separated via an insulating layer in which interference points may be present, is connected to ground via a four-terminal coupling circuit.

Due to the adjacent high voltage, it is possible, using a partial discharge measurement apparatus, to measure signals in the relevant insulating layer that are coupled out from the high-voltage circuit and supplied to the partial discharge measuring apparatus. These signals are subsequently evaluated in order to discover whether they are partial discharge signals or whether the signals are merely located in the range of standard noise. The partial discharge measurement is thereby carried out in broadband fashion, in a frequency range from approximately 40 to 400 kHz. If points of interference are present in the encapsulation compound that tend towards partial discharges with a voltage that is below or in the range of the adjacent high voltage. Thus, interference points are actually excited to the point of partial discharge and can be detected, according to the method of the present invention. The adjacent high voltage is preferably located in the range of the standard operating voltage of the conductor structure.

Using the method of the present invention, a sufficient coarse qualification can be carried out in a conductor structure in order to discover whether or not it tends towards partial discharges. With respect to the specified dimensions of a gradient coil, it is clear that a relatively large number of coils comprise points of interference, and therefore exhibit partial discharges in the frequency range under examination so that the percentage of rejections is relatively large.

In order to solve this problem, the present invention involves measuring the specified first partial discharge, after which, dependent on the result of the first analysis, the conductor is again charged with a low-frequency high voltage, and the signals are measured within a frequency range located in the MHz range, using a partial discharge measurement apparatus. The signals are then analyzed in order to determine partial discharges.

According to the present invention, a second partial discharge measurement is executed in which the conductor is again placed adjacent to low-frequency high voltage. However, in this second measurement, the signals are measured and analyzed in the MHz range. Since the relevant image signals, recorded using a magnetic resonance apparatus, likewise exhibit frequencies in the MHz range, the second measurement step allows testing even though the partial discharges determined in the first measurement step also have high-frequency portions in the MHz range, i.e., in the imaging frequency range. Thus, image disturbances during operation would also be revealed.

This is because a partial discharge found during the first examination, and whose produced signal comprises a frequency portion in the range between 40 and 400 kHz, does not always also have a frequency portion in the MHz range, which would be the actual disturbing portion. A gradient coil is therefore qualified as unusable only if partial discharge signals are determined in the MHz range that would actually lead to image disturbances. Since this is not always the case despite the presence of partial discharge signals acquired in the first measurement pass, gradient coils that would still have been rejected as unusable after the first measurement can advantageously be qualified as usable.

The partial discharge signals can thereby be measured and analyzed in a frequency range from 10 to 300 MHz, and can be measured and analyzed with particular advantage in a range from 60 to 65 MHz. The frequency of the high voltage is between 10 Hz and several kHz, and is preferably 50 Hz.

According to the present invention, two high-voltage partial discharge measurements are carried out in different frequency ranges, and the second measurement takes place in a frequency range that is relevant for imaging. The adjacent effective high voltage is thereby in a range that corresponds to the standard operating voltage of a gradient coil. In both measurements, only a high voltage is applied that falls off in quasi-static fashion between the two conductors involved, which is the insulation path to be measured. The same voltage is therefore adjacent over the entire length of the conductor, and thus the gradient coil between the two conductors.

However, this state does not correspond to the state during operation of the conductor structure. This is because during operation, current is driven via the conductors. This flow of current has the result that the voltage falls off over the length of the conductor, hence a quasi-dynamic change in voltage results over the length of the conductor. However, if the voltage falls off over the path, the possibility arises that precisely at the location at which an interference point was found in the previous static measurement in the MHz range under current load, a voltage is adjacent that is too low for the partial discharge voltage to be reached. As a result, the partial discharge determined in the static case does not occur. Such a gradient coil, which would have been qualified as unusable after the second measurement pass, can be used nonetheless, since partial discharges will not occur in operation.

Dependent on the result of the second analysis, a source of current is connected to the conductor and a current flows via the conductor, such the partial discharge signals produced as a result of a voltage gradient built up via the coil are measured and analyzed using a partial discharge measurement apparatus. The partial discharge measurement apparatus is operated within a frequency range located in the MHz range, in particular in the frequency range from 10 to 100 MHz, preferably between 60 and 65 MHz, and a preferable current of several 100 Amperes flows through the conductor. The operating state of the gradient coil is very closely approximated, so that, after execution of this third testing step, a well-founded prediction can be made as to whether or not the conductor structure will breakdown during operation.

According to the present invention, the frequency of the adjacent high voltage during the measurement under current load should be located in the range between 10 Hz and several kHz, in particular at 1 kHz. In general, the adjacent high voltage should have a magnitude from a few hundred volts up to several kV, in particular 3 kV. This is to be understood as the effective voltage.

As a result of the execution of the second, and if necessary, the third measurement steps, the method of the present invention provides a significantly more sensitive quality test that is closer to operating conditions. Independent of whether only the second step or the third measurement step is carried out if, dependent on the second or on the third analysis result, one or more measurements can be carried out in order to determine the position in the encapsulation of an interference point that is causing a partial discharge. This is due to the fact that if the respective analysis result permits the conclusion that only a few interference points are present and removal of these appears to be possible, then the additional measurement for determining the position of the interference point supplies information as to the exact location of this interference point in the encapsulation.

If the position of the interference point is known, an attempt can be made to repair the gradient coil, which in any case is presumably unusable. For the case in which the position can be determined unambiguously and a repair is successfully carried out, the gradient coil can be used, otherwise it remains rejected. First, a rough localization of the flaw can take place using the measurement under current load, by changing the direction of flow, and by using differences in the partial discharge inception voltages to draw conclusions concerning the possible position of the flaw point. Subsequently, via a calculation of the voltage distribution or electrical field distribution, the points having high voltage load can be identified. In such a step, the localization method can then be used in locally limited fashion.

Such localization methods, which can be performed with the use of a plurality of suitable sensors arranged on the gradient coil, include acoustic localization of sound waves produced by a partial discharge source, localization of magnetic and electromagnetic fields produced by a partial discharge, or measurement of runtime differences of partial discharge signals along conductors at the conductor structure operated under high voltage.

Another useful localization method makes use of an x-ray beam directed onto the gradient coil. Using a punctiform x-ray beam, the entire surface of the gradient coil is to be scanned. At the same time, a voltage that is smaller than the voltage for partial discharges is applied to the insulating layer. No partial discharge signals can be measured. If the x-ray beam comes into contact with a partial discharge source, such as a flaw or hollow space. Then, due to the energy of the x-ray beam, ionization of the charge bearers in the interference point is promoted and a measurable partial discharge is caused. In this way, the flaw can be localized in geometrically precise fashion.

SUMMARY OF THE INVENTION

It is an object of the present invention to provide a method for determining sources of interference in a magnetic resonance apparatus that cause partial discharges.

It is another object of the present invention to provide a method that enables a more sensitive testing of partial discharges in an encapsulated conductor structure.

These and other objects of the invention will be apparent upon careful review of the following detailed description of the preferred embodiment, which is to read in conjunction with careful review of the accompanying drawing figures.

DETAILED DESCRIPTION OF THE PREFERRED EMBODIMENTS

Figure 1:
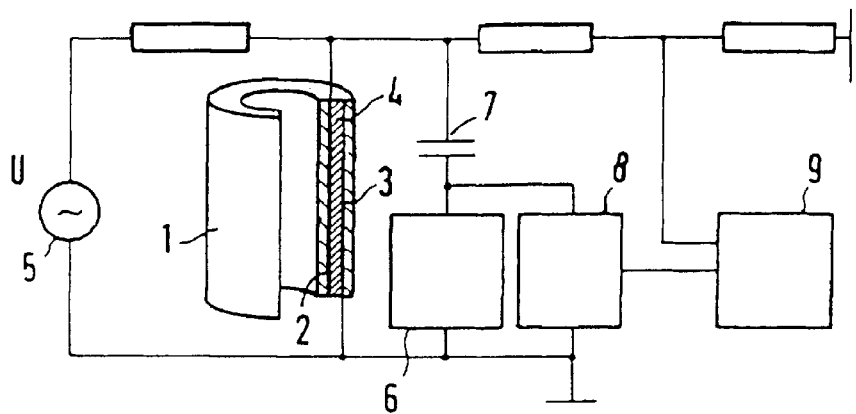
FIG. 1 shows a schematic drawing of a measurement arrangement according to the present invention.

FIG. 1 schematically shows a measurement construction designed for the execution of a "static" measurement of partial discharges in a frequency range between 40 and 400 kHz.

A gradient coil 1 is shown in which, as examples, two conductors 2, 3 are shown that are insulated from one another by an encapsulating insulating layer 4. Via a high-voltage source 5, a low-frequency high voltage is applied to the conductor 2, wherein standard parameters are U=3 kV, f=50 Hz. The second conductor 3 is grounded. Additional conductors, i.e., partial coils, which are not shown in FIG. 1 but are present in an actual gradient coil, have no definite potential during the measurement and float. Partial discharge signals are coupled out via a coupling capacitor 7, which is used to increase measurement sensitivity, and a four-terminal coupling circuit 6, to a partial discharge measurement apparatus 8.

As specified, the partial discharge measurements are carried out in broadband fashion, in a frequency range from 40 to 400 kHz. The analysis of the partial discharge signals takes place using a digital oscilloscope 9.

Figure 2:
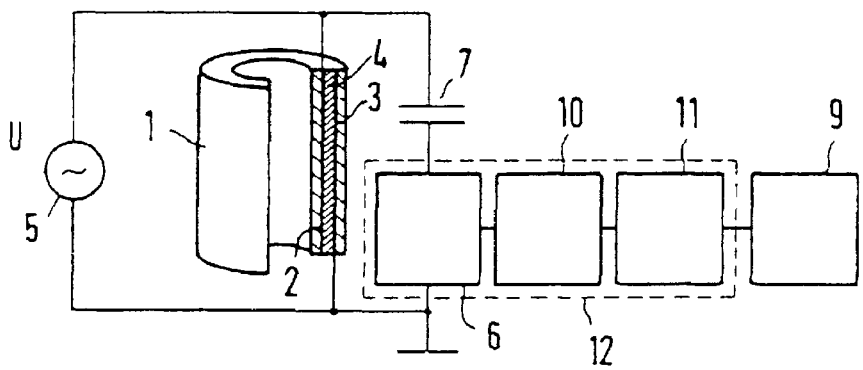
FIG. 2 shows a schematic drawing of another measurement arrangement according to the present invention.

In contrast, FIG. 2 schematically shows a measurement arrangement with which a "static" measurement in the MHz frequency range without current load can be carried out.

A voltage is applied to the conductor 2 via the high-voltage source 5. Obtained partial discharge signals are transmitted to a four-terminal coupling circuit 6 via a coupling capacitor 7. The signals adjacent to the four-terminal coupling circuit 6 are processed via a two-stage amplifier unit. The first stage is formed by a frequency amplifier 10 having a frequency of approximately 63 MHz, and the second stage is formed by a frequency amplifier 11 having a lower frequency of 47 MHz and an upper frequency of 68 MHz.

The frequency spectrum of the first amplifier stage and of the four-terminal coupling circuit are not influenced by the second amplifier stage. The four-terminal coupling circuit 6 and the two amplifiers 10, 11 form the partial discharge measurement apparatus 12. Analysis of the partial discharges takes place using a digital oscilloscope 9.

Figure 3:
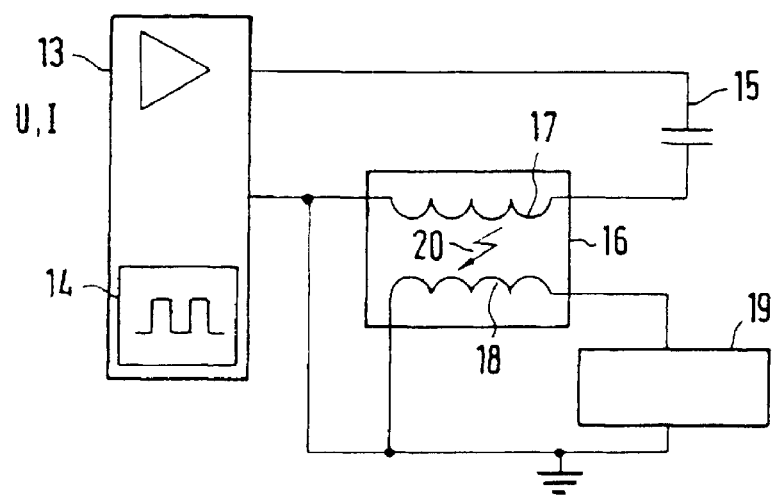
FIG. 3 shows a schematic drawing of another measurement arrangement according to the present invention.

FIG. 3 schematically shows a measurement construction with which a "dynamic" partial discharge measurement apparatus can be carried out under current load. Only the essential components are shown here. These include an amplifier 13 having integrated control apparatus 14, consisting of an oscillation circuit made up of a capacitor 15 and the object under test, here the gradient coil 16, which comprises an impedance.

The capacitor 15 is indicated here purely as an example. As a capacitive element, a component fashioned according to the requirements on the oscillation circuit or the like, such as a booster or the like, can be used. At the gradient coil, for the sake of simplicity here only two coils 17, 18 are shown, between which the insulating layer that is to be examined is located.

Using the indicated measurement construction, it is possible to apply an arbitrary current to the upper coil 17. The current-loaded coil 17 is applied to ground. A result of using a pulse-width-modulated amplifier 13, current can be produced and applied at any level that may also occur during operation. A voltage gradient then develops along the connected coil as a result of the current, dependent on the direction of flow. The coil winding located opposite the connected coil winding can either be grounded or can be at a definite potential. A partial discharge measurement apparatus 19 is arranged on the lower coil 18, at which the partial discharge 20 can be measured.

Figure 4:
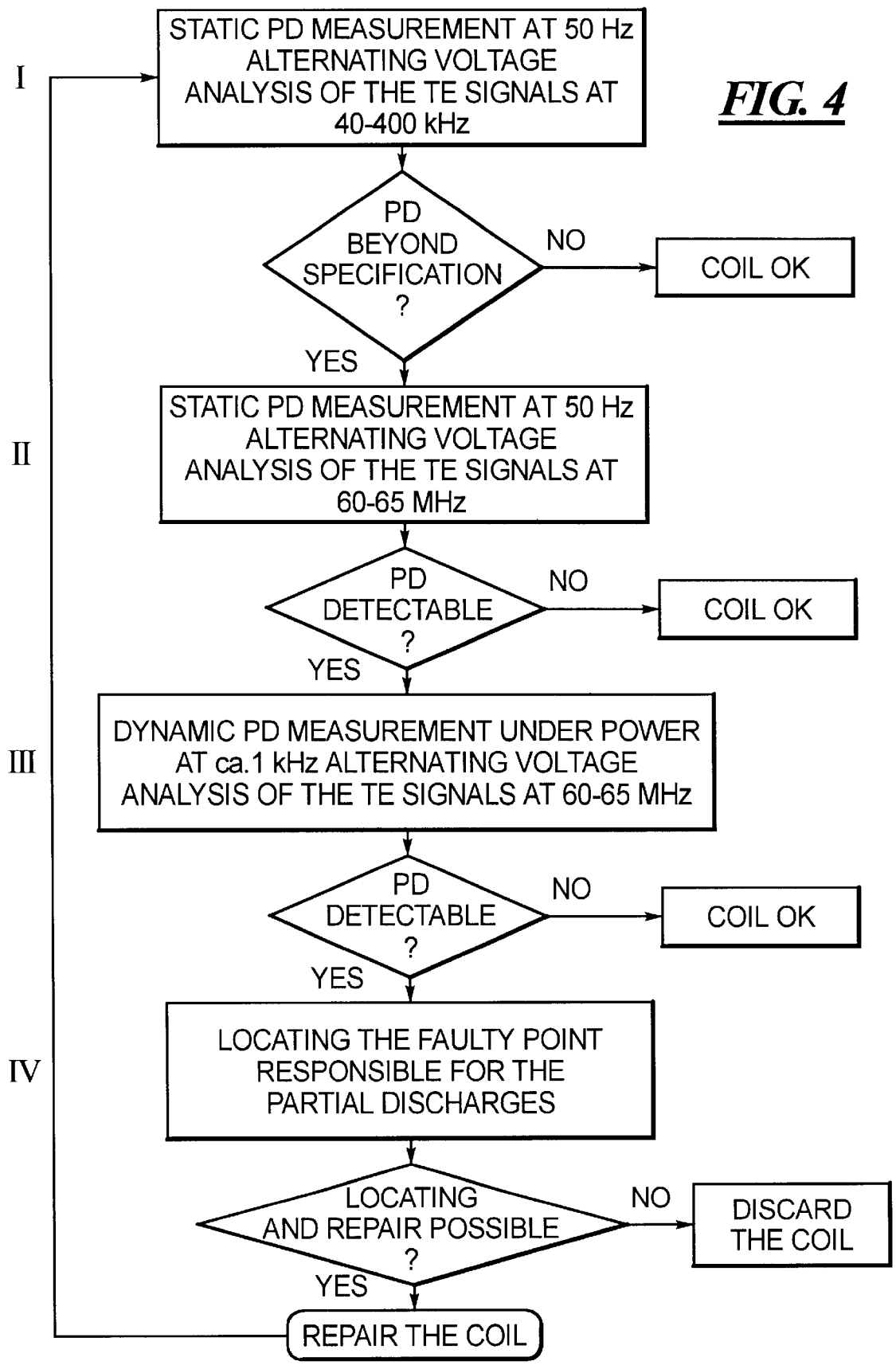
FIG. 4 shows a flow diagram according to the present invention.

FIG. 4 shows a flow diagram representing the sequence of the method of the present invention. First, with the use of the measurement arrangement shown in FIG. 1, a "static" partial discharge measurement is carried out with a high voltage of approximately 3 kV having a frequency of 50 Hz, wherein the partial discharge signals are measured and analyzed at a frequency of 40 to 400 kHz.

The abbreviation "PD" used in FIG. 4 means "partial discharge." Subsequently, it is checked whether the partial discharges lie outside the specification that describes the minimum quality requirements that a gradient coil must exhibit in order to be usable. If this is not the case, i.e., if no partial discharges, or if only negligible partial discharges occur, the gradient coil is in order and can be released.

However, if partial discharges lying outside the established limits occur, a second static partial discharge measurement takes place using the measurement construction according to FIG. 2 A high voltage of approximately 3 kV having a frequency of 50 Hz, is used, wherein partial discharge signals are measured and analyzed in the frequency range between 60 and 65 MHz. This frequency range corresponds to the frequency range of the relevant image signals of a subject of examination, for example a patient, recorded using the magnetic resonance apparatus in which a gradient coil to be tested is to be used. The partial discharge signals are analyzed in order to discover whether partial discharges can be determined. If no partial discharges occur, the coil is ready for operation and can be used. This is because this measurement ensures that even during operation of the gradient coil, no partial discharges will occur in the frequency range relevant for the image signal, namely between 60 and 65 MHz.

However, if partial discharges can be determined in the second analysis, a "dynamic" partial discharge measurement is carried out using a measurement arrangement according to FIG. 3. A high voltage of approximately 3 kV having a frequency of approximately 1 kHz, with current load is used. A source of current, such as provided by an amplifier, is connected to and carried by the conductor. The current applied to a conductor is in the range of several 100 Amperes. Measurement and analysis of the partial discharge signals takes place, preferably in the range from 60 to 65 MHz.

This "dynamic" partial discharge measurement under current load corresponds very closely to the operating conditions under which a gradient coil is operated. As a result of the adjacent current, a decreasing potential arises over the length of the coil between the two conductors under examination.

This has the result that over the length of the coil, different voltages are locally present, in contrast to the "static" measurement steps, where a constant high voltage potential is present over the entire coil length. This drop in potential has the result that regions in which partial discharges were earlier determined are now charged, if necessary, with a lowered potential that is lower than the inception voltage of the partial discharges. Thus, no partial discharges will occur in this region. If the analysis of the signals shows that no partial discharges occurred, which is closer to the conditions of operation, the gradient coil which was still judged to be faulty can be released, since in operation no partial discharges and therewith image disturbances are to be expected.

If the third analysis result still indicates partial discharges that are relevant to the image and therefore interference points, another measurement is carried out in order to locate the interference point or points responsible for the partial discharges.

For this purpose, acoustic localization methods, localization methods for the determination of magnetic fields produced by partial discharges, or localization methods based on measurements of runtime differences and on partial discharge breakdowns triggered by an x-ray beam scanning the gradient coil, can be carried out on the gradient coil operated under high voltage with the use of suitable sensors. If this measurement yields the result that a localization or repair is not possible, the gradient coil is to be rejected.

If a localization can be successfully carried out and the prospects of repair seem favorable, repair of the gradient coil takes place. After the conclusion thereof, the gradient coil is again subjected to measurement, followed if necessary by the further measurements, as set forth above.

Figure 5:
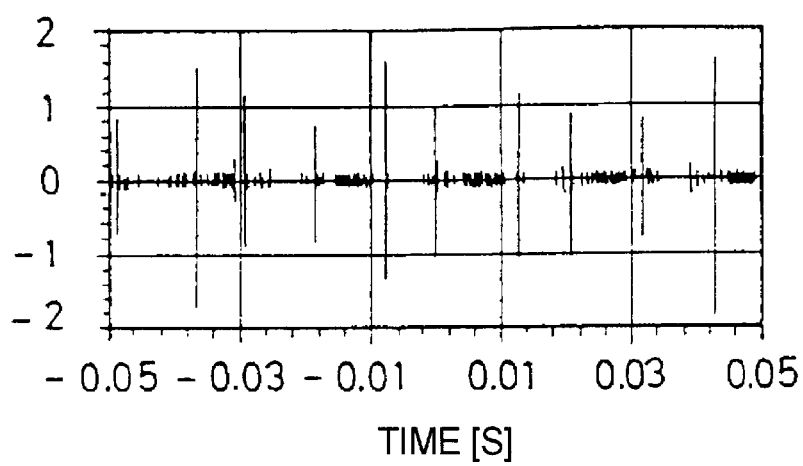
FIGS. 5–7 show measurement diagrams according to the present invention.
Figure 6:
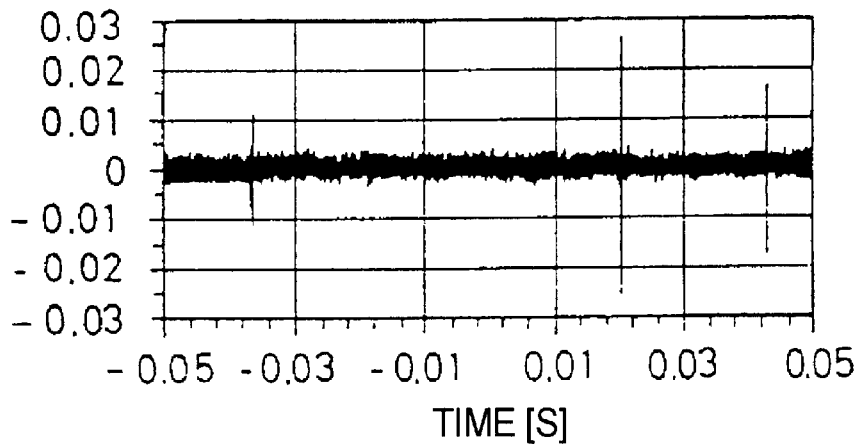
Figure 7:
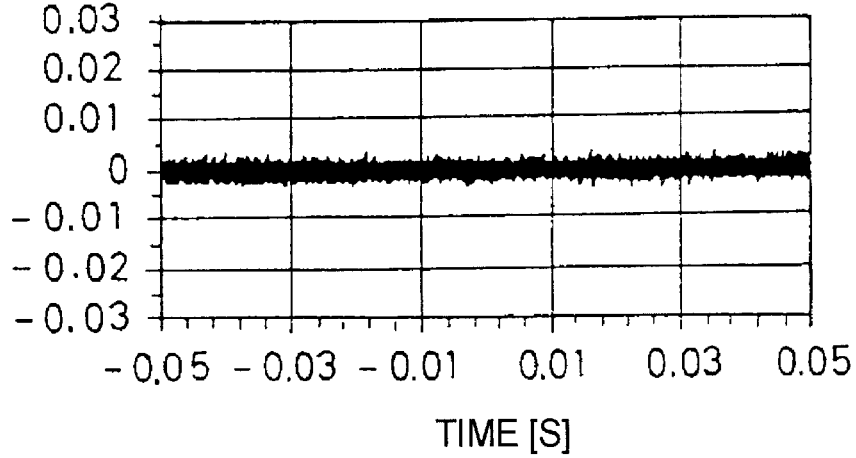

FIGS. 5 to 7 show measurements included in partial discharge measurement, and the obtained measurement signal voltage is respectively plotted over time.

As FIG. 5 shows, in the context of the "static" measurement at 40 to 400 kHz, a total of 10 partial discharges were determined which can be clearly recognized on the basis of the peaks.

FIG. 6 shows the measurement result of the "static" measurement having a measurement frequency between 60 and 65 MHz. As can be seen, only three partial discharges having a signal portion in the measured frequency range were measurable. A correlation of the signal amplitudes at a low frequency according to FIG. 5 with those at a higher frequency according to FIG. 6 is not possible, taken on the basis of the signal pulse at t=0.02 s. This peak has the greatest amplitude in the high-frequency measurement, while it comprises the lowest amplitude in the low-frequency measurement. However, in the frequency range relevant for imaging, only three partial discharges are still relevant.

FIG. 7 shows an example of a subsequently conducted measurement under current load. In this measurement, which is closest to operating conditions, no relevant partial discharges are determined and only standard noise is still measurable. This means that in operation, the gradient coil under examination will exhibit no disturbances due to partial discharges that could have a disadvantageous effect on the image recording. The coil can therefore be released, based upon the result of the measurement shown in FIG. 7.

Although modifications and changes may be suggested by those skilled in the art to which this invention pertains, its is the invention of the inventors to embody within the patent warranted hereon, all changes and modifications that may reasonably and properly come under the scope of their contribution to the art.

What is claimed is:

1. A method for determining sources of interference that cause partial discharges in an encapsulated conductor structure made up of a plurality of separate conductors of a magnetic resonance apparatus, the method comprising the steps of applying a low-frequency high voltage to a conductor;

measuring partial discharge signals resulting from the adjacent high voltage using a partial discharge measurement apparatus within a frequency range in the KHz range;

analyzing the signals measured in order to determine partial discharges;

charging the conductor again with a low-frequency high voltage, dependent on the result of the first analysis;

measuring partial discharge signals using a partial discharge measurement apparatus within a frequency range in the MHz range; and analyzing the signals in order to determine partial discharges.

2. The method according to claim 1, wherein the partial discharge signals are measured and analyzed within a frequency range of 10 to 300 MHz.

3. The method according to claim 2, wherein the partial discharge signals are measured and analyzed within a frequency range of 60 to 65 MHz.

4. The method according to claim 3, wherein the frequency of the high voltage is between 10 Hz and several kHz, being in particular 50 Hz.

5. The method according to claim 4, further comprising the steps of:

sending a current through the conductor dependent on the second analysis result;

measuring and analysis the possible signals caused due to a voltage gradient developed as a result of the current flow using a partial discharge measurement apparatus within a frequency range in the MHz range, in particular in the frequency range from 10 to 300 MHz, preferably between 60 and 65 MHz.

6. The method according to claim 5, wherein a current of several hundred amperes is conducted via the conductor.

7. The method according to claim 6, wherein the frequency of the high voltage is in the range between 10 Hz and several kHz, being in particular 1 kHz.

8. The method according to claim 7, wherein the adjacent high voltage is from 100 volts to several kV, being in particular 3 kV.

9. The method according to claim 8, further comprising the step of:

carrying out one or more measurements to determine the position of an interference point in the encapsulation causing a partial discharge, dependent on one of the second or the third analysis result.

10. The method according to claim 9, further comprising the step of:

determining via at least one of, acoustic localization of sound waves, partial discharge, localization of magnetic fields produced by partial discharge, measurement of runtime differences of partial discharge signals, or measurement of partial discharge signals triggered by an x-ray beam scanning an encapsulated conductor structure, the location in the encapsulated conductor structure causing a partial discharge.

* * * * *